(12) United States Patent
Chumakov et al.

(10) Patent No.: US 8,497,583 B2
(45) Date of Patent: Jul. 30, 2013

(54) STRESS REDUCTION IN CHIP PACKAGING BY A STRESS COMPENSATION REGION FORMED AROUND THE CHIP

(75) Inventors: Dmytro Chumakov, Dresden (DE); Michael Grillberger, Radebeul (DE); Heike Berthold, Hirschfeld (DE); Katrin Reiche, Goltzscha (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 330 days.

(21) Appl. No.: 12/964,448

(22) Filed: Dec. 9, 2010

(65) Prior Publication Data

US 2011/0291299 A1    Dec. 1, 2011

(30) Foreign Application Priority Data

May 31, 2010  (DE) .......................... 10 2010 029 522

(51) Int. Cl.
 *H01L 29/40* (2006.01)
(52) U.S. Cl.
 USPC .......................................... 257/778; 438/108
(58) Field of Classification Search
 USPC .......................................... 257/778; 438/104
 See application file for complete search history.

(56) References Cited

U.S. PATENT DOCUMENTS

| 7,151,308 B2 * | 12/2006 | Tao et al. ...................... 257/683 |
| 2008/0174004 A1 * | 7/2008 | Nakagawa ..................... 257/690 |

FOREIGN PATENT DOCUMENTS

| DE | 198 00 928 A1 | 4/1999 |
| DE | 103 61 106 A1 | 5/2005 |
| DE | 101 33 571 B4 | 12/2005 |

OTHER PUBLICATIONS

Translation of Official Communication from German Patent Office for German Patent Application No. 10 2010 029 522.1-33 dated Apr. 4, 2011.

* cited by examiner

*Primary Examiner* — Julio J Maldonado
*Assistant Examiner* — Robert Bachner
(74) *Attorney, Agent, or Firm* — Williams, Morgan & Amerson, P.C.

(57) ABSTRACT

A stress compensation region that may be appropriately positioned on a package substrate may compensate for or at least significantly reduce the thermally induced mechanical stress in a sensitive metallization system of a semiconductor die, in particular during the critical reflow process. For example, a stressor ring may be formed so as to laterally surround the chip receiving portion of the package substrate, wherein the stressor ring may efficiently compensate for the thermally induced deformation in the chip receiving portion.

13 Claims, 4 Drawing Sheets

STRESS REDUCTION IN CHIP PACKAGING BY A STRESS COMPENSATION REGION FORMED AROUND THE CHIP

BACKGROUND OF THE INVENTION

1. Field of the Invention

Generally, the present disclosure relates to integrated circuits, and, more particularly, to the techniques for reducing chip-package interactions caused by thermal mismatch between the chip and the package substrate.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable base materials for forming semiconductor devices, such as microprocessors, SRAMs, ASICs (application specific ICs), systems on chip (SoC) and the like. The individual integrated circuits are arranged in an array on the wafer, wherein most of the manufacturing steps, which may involve several hundred and more individual process steps in sophisticated integrated circuits, are performed simultaneously for all chip areas on the substrate, except for photolithography processes, metrology processes and packaging of the individual devices after dicing the semiconductor substrate. Thus, economic constraints drive semiconductor manufacturers to steadily increase the substrate dimensions, thereby also increasing the area available for producing actual semiconductor devices and thus increasing production yield.

In addition to increasing the substrate area, it is also important to optimize the utilization of the substrate area for a given substrate size so as to actually use as much substrate area as possible for semiconductor devices and/or test structures that may be used for process control. In an attempt to maximize the useful surface area for a given substrate size, the feature sizes of circuit elements are steadily scaled down. Due to this ongoing demand for shrinking the feature sizes of highly sophisticated semiconductor devices, copper, in combination with low-k dielectric materials, has become a frequently used alternative in the formation of so-called interconnect structures comprising metal line layers and intermediate via layers that include metal lines as intra-layer connections and vias as inter-layer connections, which commonly connect individual circuit elements to provide the required functionality of the integrated circuit. Typically, a plurality of metal line layers and via layers stacked on top of each other is necessary to realize the connections between all internal circuit elements and I/O (input/output), power and ground pads of the circuit design under consideration.

For extremely scaled integrated circuits, the signal propagation delay is no longer limited by the circuit elements, such as field effect transistors and the like, but is limited, owing to the increased density of circuit elements requiring an even more increased number of electrical connections, by the close proximity of the metal lines, since the line-to-line capacitance is increased and the conductivity of the lines is reduced due to a reduced cross-sectional area. For this reason, traditional dielectrics, such as silicon dioxide (k>3.6) and silicon nitride (k>5), are replaced by dielectric materials having a lower permittivity, which are, therefore, also referred to as low-k dielectrics, having a relative permittivity of 3 or less. However, the density and mechanical stability or strength of the low-k materials may be significantly less compared to the well-approved dielectrics silicon dioxide and silicon nitride. As a consequence, during the formation of the metallization system and any subsequent manufacturing processes of integrated circuits, production yield may depend on the mechanical characteristics of sensitive dielectric materials, such as low-k dielectric layers, and their adhesion to other materials.

In addition to the problems of reduced mechanical stabilities of advanced dielectric materials having a dielectric constant of 3.0 and significantly less, device reliability may also be affected by these materials during operation of sophisticated semiconductor devices due to an interaction between a chip and the package, wherein this interaction is caused by a thermal mismatch of the corresponding thermal expansion of the different materials. For instance, in the fabrication of complex integrated circuits, increasingly, a contact technology may be used for connecting the package substrate to the chip, which is known as flip chip packaging technique. Contrary to the well-established wire bonding techniques in which appropriate contact pads may be positioned at the periphery of the very last metal layer of the chip, which may be connected to corresponding terminals of the package by a wire, in the flip chip technology, a respective bump or pillar structure may be formed on the last metallization layer, for instance comprised of a solder material, which may be brought into contact with respective contact pads of the package. Thus, after reflowing the bump material, a reliable electrical and mechanical connection may be established between the last metallization layer and the contact pads of the package substrate. In this manner, a very large number of electrical connections may be provided across the entire chip area of the last metallization layer with reduced contact resistance and parasitic capacitance, thereby providing the IO (input/output) capabilities as required for complex integrated circuits, such as CPUs, storage memories and the like. During the corresponding process sequence for connecting the bump structure with a package substrate, a certain degree of pressure and/or heat may be applied to the composite device so as to establish a reliable connection between each of the bumps formed on the chip and the bumps or pads that may be provided on the package substrate. The thermally or mechanically induced stress may, however, also act on the lower lying metallization layers, which may typically include low-k dielectrics or even ultra low-k (ULK) dielectric materials, thereby significantly increasing the probability of creating defects by delamination of these sensitive materials due to reduced mechanical stability and adhesion to other materials.

Moreover, during operation of the composite semiconductor device, i.e., the semiconductor chip attached to the corresponding package substrate, significant mechanical stress may also occur due to a significant mismatch in the thermal expansion behavior of the silicon-based semiconductor chip and the package substrate, since, in volume production of sophisticated integrated circuits, economic constraints typically require the usage of specified substrate materials for the package, such as organic materials, which may typically exhibit a different thermal conductivity and a different coefficient of thermal expansion compared to the silicon chip. Consequently, a premature failure of the metallization system may occur.

With reference to FIGS. 1a-1b, a typical chip-package interaction will be described in more detail.

FIG. 1a schematically illustrates a cross-sectional view of an integrated circuit 100 comprising a semiconductor die or chip 150 connected to a package substrate 170, which is substantially comprised of an organic material, such as a polymer material and the like. As discussed above, in total, the semiconductor chip 150 has a coefficient of thermal expansion (CET) that is significantly different from the CET of the package substrate 170, that is, typically, the CET of the package substrate 170 may be greater compared to the silicon-based semiconductor die 150. The semiconductor die 150 typically comprises a substrate 151, for instance in the form of a silicon substrate or an SOI substrate, depending on the overall configuration of the circuit layout and performance of the integrated circuit 100. Moreover, a silicon-based semiconductor layer 152 is provided "above" the substrate 151, wherein the semiconductor layer 152 comprises a very large number of circuit elements, such as transistors, capacitors, resistors and the like, as are required for implementing the desired functionality of the integrated circuit 100. As previously discussed, the ongoing shrinkage of critical dimensions of circuit elements has resulted in critical dimensions of transistors on the order of magnitude of 50 nm and significantly less in presently available sophisticated semiconductor devices that are produced by volume production techniques.

The semiconductor chip 150 further comprises a metallization system 153, which, in advanced semiconductor devices, comprises a plurality of metallization layers, i.e., device levels in which metal lines and vias are embedded in an appropriate dielectric material. As explained above, at least a portion of the corresponding dielectric materials used in the various metallization layers of the metallization system 153 are comprised of materials of reduced mechanical stability in order to provide as low a parasitic capacitance of adjacent metal lines as possible. Moreover, the device 150 comprises a bump structure 155 that is appropriately connected to the metallization system 153, wherein the corresponding bumps or metal pillars may be provided as a part of the last metallization layer of the system 153, for instance in the form of a solder material, metal pillars or a combination thereof. On the other hand, the package substrate 170 comprises appropriately positioned and dimensioned contact pads of a contact structure 175, which may be brought into contact with the corresponding bumps of the structure 155 in order to establish respective mechanical and electrical connections upon applying heat and mechanical pressure. Furthermore, the package substrate 170 may comprise any appropriate conductive lines (not shown) in order to connect the bump structure 155 with appropriate terminals, which thus establish an electrical interface to other peripheral components, such as a printed wiring board and the like.

During operation and also during the process of forming the composite device 100 from the semiconductor die 150 and the package substrate 170, heat is generated in the semiconductor chip 150 or is transferred thereto, which may finally result in a significant interaction between the semiconductor die 150 and the package substrate 170, for instance after reflowing and hardening of the bumps in the structure 155, which may thus result in significant shear forces due to the mismatch in the CETs of the device 150 and 170. For example, at the interface between the semiconductor die 150 and the package substrate 170, that is, in particular, the bump structure 155 and the metallization system 153 may experience significant mechanical stress forces caused by the thermal mismatch during assembly and operation of the device 100. Due to the reduced mechanical stability and the reduced adhesion of sophisticated dielectric materials, corresponding defects typically occur, which thus affect the overall reliability and also production yield when operating or manufacturing the integrated circuit 100. For example, a certain degree of thermally induced stress, as indicated by 103, may occur in the package substrate 170, thereby resulting in a certain degree of bending or bowing, indicated by 176, due to any temperature gradients and the increased CET of the material 170 compared to the semiconductor die 150.

FIG. 1*b* schematically illustrates an enlarged view of a portion of the metallization system 153 during a typical situation when operating the integrated circuit 100 or when assembling the device 100 in a final phase, when the solder bumps increasingly harden after reflowing of any solder material. As illustrated, the metallization system 153 comprises the plurality of metallization layers, wherein, for convenience, two metallization layers 154 and 156 are illustrated. For example, the metallization layer 156 comprises a dielectric material 156A, in which corresponding metal lines 156B and vias 156C are embedded. Similarly, the metallization layer 154 comprises a dielectric material 154A and respective metal lines 154B and vias 154C. As previously explained, at least some of the metallization layers in the metallization system 153 comprise a sensitive dielectric material in the form of a low-k dielectric material or a ULK material, which exhibits a significantly reduced mechanical stability compared to other dielectrics, such as silicon nitride, silicon carbide, nitrogen-containing silicon carbide, which may frequently be used as etch stop or capping layers provided between the individual metallization layers 154, 156. Consequently, during operation or assembly of the integrated circuit 100, due to the different behavior with respect to thermal expansion, a significant mechanical stress is transferred into the metallization layers 156, 154, as indicated by 103. The stress 103 is also present in the package substrate 170 (FIG. 1*a*), and may result in a material deformation, as indicated by 176 (FIG. 1*a*). On the other hand, the mechanical stress 103 in the metallization system 153 may induce a more or less pronounced strained state that results in the creation of certain defects 154D, 156D, which in turn may finally result in a certain degree of delamination, since typically the adhesion and mechanical stability of ULK dielectric materials is reduced compared to conventional dielectric materials, as discussed above. Consequently, the resulting delamination may finally result in a premature failure of the metallization system 153 or in an initial failure of the metallization system, thereby contributing to reduced production yield and reduced overall reliability of the integrated circuit 100 (FIG. 1*a*).

The problem of reduced reliability and reduced production yield of sophisticated metallization systems is even further exacerbated in advanced process technologies in which the dielectric constant of the low-k dielectric materials is to be further reduced, while at the same time the dimensions of the corresponding chip areas are increased in order to incorporate more and more functions into the integrated circuits. On the other hand, the increased complexity of the overall circuit layout may also require an increased number of stacked metallization layers, as previously explained, which may additionally result in a reduced overall mechanical stability of the metallization system. Furthermore, the usage of lead-free materials in the bump structure 155 (FIG. 1*a*) may result in an increased mechanical coupling of the package substrate 170 and the semiconductor chip 150, thereby resulting in even higher mechanical stress, since, typically, lead-free contact assemblies are less resilient compared to lead-containing solder materials.

For these reasons, in conventional approaches, the overall size of the semiconductor die has to be restricted to appropriate dimensions in performance driven metallization systems so as to maintain the overall mechanical stress components at an acceptable level. In other cases, the number of metallization layers may be restricted, thereby also reducing the packing density and/or complexity of the circuit layout. In still other conventional approaches, less sophisticated dielectric materials are used in order to enhance the overall mechanical stability, thereby, however, sacrificing performance of the integrated circuits.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure addresses the problem of yield losses and reduced reliability in packaged semiconductor devices caused by the thermal mismatch between a complex semiconductor die and a package substrate, in particular during the assembly of the packaged semiconductor device, by providing semiconductor devices, superior package substrate and assembly techniques in which the thermally induced deformation of the package substrate may be reduced. To this end, a stress compensation region may be locally provided in the package substrate prior to or during the process of assembling a semiconductor device in order to reduce the degree of substrate deformation, in particular during the process of directly connecting a chip contact structure with the complementary contact structure of the package substrate. The stress compensation region may be appropriately positioned above the package substrate in order to endow a specific portion, which may receive the semiconductor die with superior mechanical characteristics, in order to reduce the degree of deformation during situations of elevated temperatures and temperature gradients occurring in the composite semiconductor device. The stress compensation region may thus represent any appropriate component which may substantially not affect the electrical characteristics of the package substrate, while, on the other hand, the thermally induced stress in the chip receiving portion may be efficiently reduced, thereby also reducing the chip package interaction, for instance during the critical phase of reflowing and hardening a solder material. Furthermore, the stress compensation region may also provide superior stress conditions during operation of the composite semiconductor device, thereby also contributing to superior overall reliability of complex semiconductor devices which may comprise metallization systems having incorporated therein sophisticated dielectric materials. In some illustrative aspects disclosed herein, the stress compensation region may be provided as a separate component that may be appropriately attached to the package substrate, for instance on the basis of a bump structure, in order to provide a substantially rigid mechanical connection between the stress compensation region and a portion of the package substrate. The material characteristics of the stress compensation region may be selected such that the mechanical stress, caused by any temperature gradients or by the mismatch between the CETs (coefficient of thermal expansion) of the semiconductor die and the package substrate may be reduced or the deformation of the package substrate, at least in the chip receiving portion, may be reduced or substantially completely avoided. To this end, appropriate rigid materials having a different CET compared to the remaining package substrate may be positioned in close proximity to the chip receiving portion and may extend along a significant part of the circumference of the chip receiving portion or may substantially completely laterally enclose the chip receiving portion.

One illustrative semiconductor device disclosed herein comprises a semiconductor chip comprising a chip contact structure and a package substrate that comprises a substrate portion connected to the chip contact structure. The semiconductor device further comprises a stress compensation region formed in contact with the package substrate laterally adjacent to the semiconductor chip, wherein the stress compensation region is configured to reduce a thermally induced deformation in the substrate portion.

One illustrative package for receiving a semiconductor chip as disclosed herein comprises a package substrate and a stress compensation region formed above the package substrate. The stress compensation region extends at least along a portion of a circumference of a chip receiving section of the package substrate, wherein the stress compensation region has a different coefficient of thermal expansion compared to the package substrate. Moreover, the package comprises a package contact structure formed above the package substrate in the chip receiving section and is configured to directly connect to a complementary contact structure of the semiconductor chip.

One illustrative method disclosed herein relates to forming a packaged semiconductor device. The method comprises attaching a semiconductor chip to a chip receiving section of a package substrate by directly connecting a chip contact structure and a complementary package contact structure. The method further comprises forming a stress compensation region above the package substrate so as to extend along at least a portion of a circumference of the chip receiving section, wherein the stress compensation region reduces a deformation in the chip receiving section when attaching the semiconductor chip to the chip receiving section.

BRIEF DESCRIPTION OF THE DRAWINGS

The disclosure may be understood by reference to the following description taken in conjunction with the accompanying drawings, in which like reference numerals identify like elements, and in which.

Figure 1A:
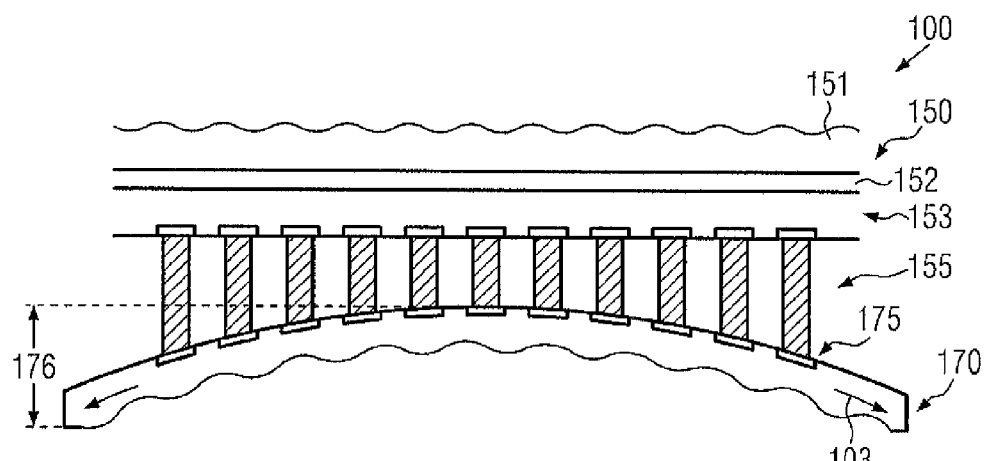
FIG. 1a schematically illustrates a cross-sectional view of a packaged semiconductor device including a complex semiconductor die that comprises a sophisticated metallization system, which is directly connected to a package substrate, thereby resulting in a significant thermally induced deformation of the package substrate, according to conventional direct package/die contact regimes.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides packaged semiconductor devices, package substrates and techniques for assembling the packaged semiconductor devices, wherein the thermally induced stress in a complex metallization system, in particular during the critical assembling process, may be reduced by efficiently reducing the degree of deformation, at least in a portion of the package substrate. To this end, appropriately selected components of appropriate geometrical configuration may be provided "above" the package substrate, i.e., above a front side thereof or a rear side thereof, or above both sides of the package substrate, in order to reduce the mechanical deformation of a specific portion of the package substrate to which the semiconductor die may be attached. For this purpose, the material characteristics and the geometry and positioning of the material components, which may also be referred to herein as stress compensation components or regions, may be appropriately selected so as to reduce or eliminate a significant mechanical deformation of the portion of the package substrate under consideration. The stress compensation components or regions may be provided initially as separate elements which may be rigidly attached to the package substrate, for instance prior to or during the process for assembling the composite semiconductor device, thereby imparting superior stability to at least the chip receiving portion, in particular during the critical chip package interaction when forming the packaged semiconductor device. The stress compensation components or regions may, for instance, reduce or compensate for the thermally induced strain or deformation, thereby efficiently reducing any thermally induced undue stress components in the semiconductor die, which are typically transferred via the contact structure, wherein, in particular, contact elements such as solder bumps, metal pillars and the like at the edge of the semiconductor die may exert significant mechanical stress forces into a complex metallization system of the semiconductor die. Consequently, upon reducing or compensating for the thermally induced strain in the package substrate, at least within the chip receiving portion, the required elevated temperatures may be applied during the reflow process, as may typically be associated with lead-free solder materials, thereby contributing to superior reliability of the resulting inter-metallic connections between the contact structure of the semiconductor die and the contact structure of the package substrate. Furthermore, sophisticated bump structures including metal pillars may be used, which may typically provide superior electrical performance, which, however, may generally induce increased shear forces in the metallization system when a pronounced mechanical deformation may occur in the package substrate.

In some illustrative embodiments disclosed herein, the stress compensation region or component may be attached to the package substrate on the basis of a contact regime, which may be similar to the contact regime for attaching the semiconductor die to the package substrate. In this way, established process techniques and material systems may be used for appropriately positioning the stress compensation region so as to be in contact with the package substrate. Moreover, the stress compensation components or regions may be formed on the basis of any appropriate manufacturing technique, for instance using semiconductor processing techniques and materials, thereby providing a high degree of compatibility with conventional process strategies. For example, the stress compensation region may be formed by attaching one or more components to the package substrate during a process sequence in which the semiconductor die may also be attached to the package substrate. Typically, during a corresponding assembling process, the semiconductor die and the package substrate may be heated to an appropriate reflow temperature in order to reflow the solder material and thus provide the inter-metallic connection between the chip contact structure and the package contact structure. Thereafter, the composite semiconductor device may cool down, wherein, typically, the periphery may cool down faster compared to the central areas of the composite semiconductor device, so that the peripheral solder bumps or metal pillars may solidify first and may thus experience the significant mechanical stresses first, which are caused by the mismatch in thermal expansion between the package substrate and the semiconductor die. Thus, the package substrate may typically contract in a more pronounced manner compared to the semiconductor die, wherein, in particular, the solder bumps at the periphery of the semiconductor die may counteract the contraction of the package substrate, thereby typically resulting in a mechanical deformation, i.e., a bowing of the package substrate. Consequently, by positioning stress compensation components or regions in the vicinity of the peripheral solder bumps and by appropriately selecting the CET of the stress compensation region, the mechanical stress in the semiconductor die upon cooling down the composite semiconductor device may be reduced, thereby also reducing the probability of creating significant mechanical damage in the sensitive metallization system. For example, the stress compensation region may be positioned at the same side of the package substrate as the semiconductor die and may extend along a significant portion of the circumference of the semiconductor die, thereby enabling a very efficient assembling process since, for instance, the stress compensation region and the semiconductor die may be commonly attached to the package substrate, while at the same time the mechanical stress may be efficiently reduced, in particular when the stress compensation region may be provided in the form of a substantially closed configuration that completely laterally encloses the semiconductor die. In other cases, a stress compensation region may be positioned above the opposite substrate surface which the semiconductor die may be attached to, thereby providing superior flexibility in positioning the stress compensation region. In further illustrative embodiments, stress compensation regions may be provided on both sides of the package substrate in order to even more efficiently compensate for the thermally induced deformation in the chip receiving portion and thus compensate for mechanical stress in the sensitive metallization system. Consequently, the overall configuration of the stress compensation region and the processes for finally attaching the semiconductor die to the package substrate may provide a high degree of flexibility, for instance in terms of process efficiency, degree of stress compensation in the metallization system and the like.

Figure 1B:
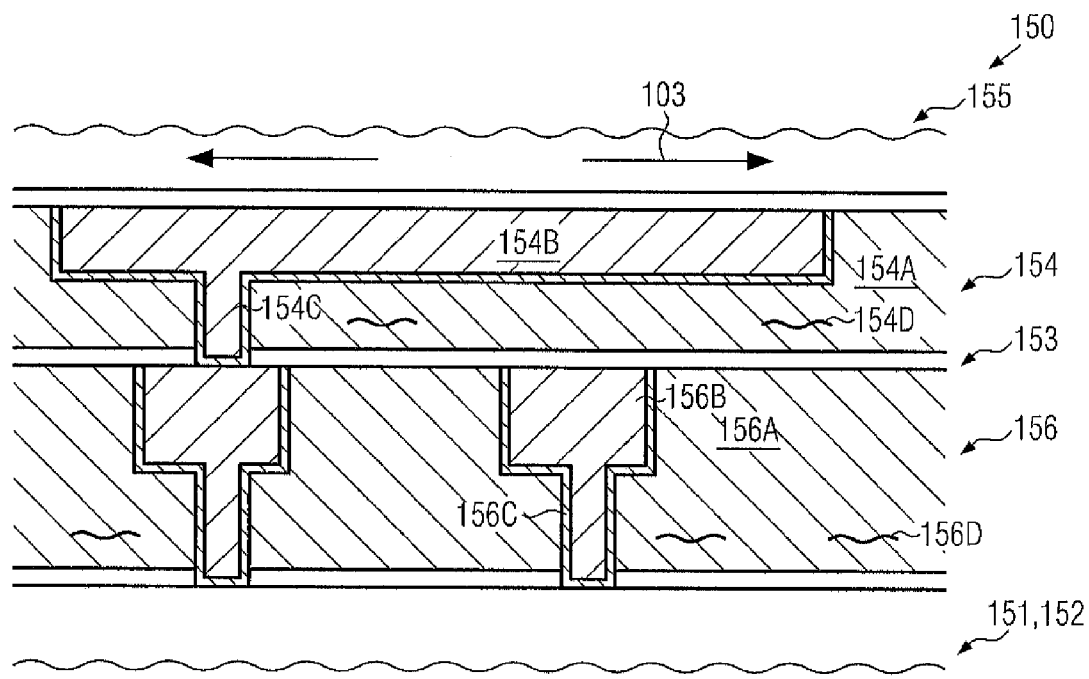
FIG. 1b schematically illustrates a portion of the complex metallization system of the semiconductor die of FIG. 1a, wherein the plurality of defects are generated, in particular, during the critical assembly process for connecting the semiconductor die and the package substrate.

With reference to FIGS. 2a-2g, further illustrative embodiments will now be described in more detail, wherein reference may also be made to FIGS. 1a-1b, if required.

Figure 2A:
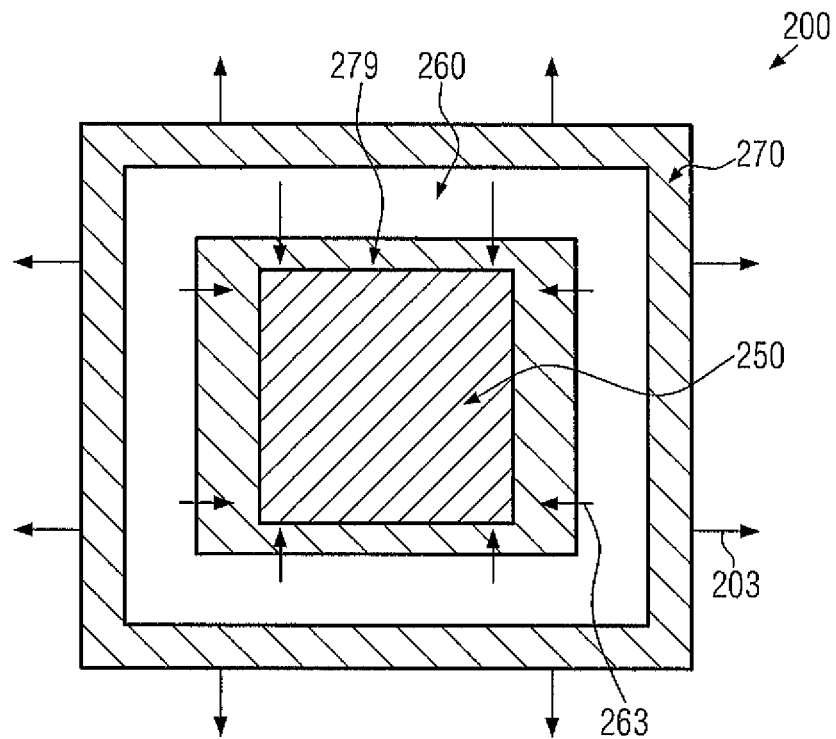
FIGS. 2a-2b schematically illustrate a top view and a cross-sectional view, respectively, of a semiconductor device in a packaged configuration, wherein a package substrate may comprise a stress compensation region in order to reduce the thermally induced deformation in a portion of the substrate which has attached thereto the semiconductor die, according to illustrative embodiments.

FIG. 2a schematically illustrates a top view of a packaged semiconductor device 200 comprising a semiconductor chip or die 250, which may have any appropriate configuration in terms of chip size, material composition and the like. In particular, the semiconductor die 250 may comprise a plurality of circuit elements forming any complex circuitry, wherein a complex metallization system may be provided on the basis of low-k dielectric materials of reduced mechanical stability, as is also described with reference to FIGS. 1a-1b when referring to the integrated circuit 100. For example, the semiconductor die 250 may have a similar configuration, for instance with respect to the metallization system and the like, as is described with reference to the device 100. Consequently, any further detailed description of these components may be omitted here. Furthermore, the composite semiconductor device 200 may comprise a package substrate 270 having any appropriate size so as to receive the semiconductor die 250 within a dedicated portion 279, which may also be referred to herein as a chip receiving portion. Furthermore, the device 200 may comprise a stress compensation region or component 260 which, in the embodiment shown, may be formed along the circumference of the chip receiving portion 279 and may be laterally offset from the semiconductor die 250 so as to not unduly interfere with any contact structure and positioning procedures, as may typically be applied upon assembling the composite semiconductor device 200. In the embodiment shown, the stress compensation region 260 may be provided in the form of a "stressor ring," while in other cases any other appropriate configuration may be selected, for instance a plurality of individual components may be provided in close proximity to the semiconductor die 250. As illustrated, the composite semiconductor device 200 may be illustrated in a situation in which thermally caused strain or stress may occur in the package substrate 270, as indicated by 203, for instance caused by heating or cooling down the device 200, wherein the difference in CET between the chip 250 and the package substrate 270 may result in corresponding stress components. However, contrary to conventional package substrates, the stress compensation region 260 may be appropriately configured so as to reduce or even compensate for the stress components 203, at least within the chip receiving portion 279, by inducing an inversely oriented stress or strain component, as indicated by 263. Consequently, the resulting thermally induced strain or deformation within the chip receiving portion 279 may be reduced, thereby also reducing the finally generated mechanical stress in the semiconductor die and in particular in the complex metallization system provided therein.

Figure 2B:
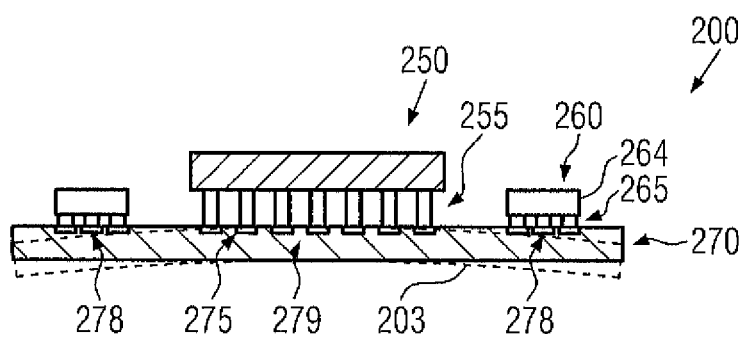

FIG. 2b schematically illustrates a cross-sectional view of the composite semiconductor device 200 according to illustrative embodiments. As shown, the semiconductor die 250 may be attached to the chip receiving portion 279 on the basis of an appropriate bump or pillar structure 255, which connects to a complementary package contact structure 275. It should be appreciated that, with respect to the bump structure 255, the same criteria may apply as previously explained with reference to the semiconductor device 150 of the composite integrated circuit 100. That is, the contact structure 255 may comprise appropriate contact elements in the form of metal pillars and/or solder bumps, typically comprised of a lead-free solder material, which may generally have a reduced resilient nature compared to lead-containing solder materials. Moreover, as discussed above, typically, lead-free solder materials may require increased reflow temperatures upon connecting the semiconductor die 250 to the package contact structure 275. Thus, in conventional strategies, the increased reflow temperatures in combination with the reduced resiliency of the solder material may result in increased mechanical stress in the semiconductor die 250, and in particular in the sensitive metallization system, as previously discussed with reference to the metallization system 153 (FIG. 1b). In the embodiment shown, the stress compensation region 260 may be provided above the same surface of the substrate 270 as the semiconductor chip 250 and may provide a reduced degree of deformation within the chip receiving portion 279, as is also indicated in FIG. 2a. In the embodiment shown, the stress compensation region 260 may comprise an appropriate material 264, such as a substrate material and the like, which may comprise an appropriate contact structure 265, for instance in the form of solder bumps, metal pillars and the like. The contact structure 265 may connect to a complementary contact structure 278 so as to provide a rigid mechanical connection between the stress compensation region 260 and the package substrate 270. It should be appreciated that providing the stress compensation region 260 and the semiconductor die 250 above the same side of the substrate 270 may provide a very efficient overall process flow, for instance in terms of substrate handling, attaching the region 260 and the die 250 to the package substrate 270 and the like. In other illustrative embodiments (not shown), the stress compensation region 260 may be positioned at the opposite side of the package substrate 270, while, in still other illustrative embodiments, one or more stress compensation components or regions may be formed at the front side and rear side of the package substrate 270, thereby providing a high degree of flexibility in selecting an appropriate position of the stress compensation components without interfering with the signal routing in and on the package substrate 270.

The substrate 264 of the stress compensation region 260 may be provided in the form of any appropriate material, such as semiconductor materials, well-established dielectric materials, such as silicon dioxide, silicon nitride and the like, wherein a plurality of appropriate thermal characteristics may thus be implemented into the substrate 264 by selecting one or more appropriate materials. For example, the coefficient of thermal expansion (CET) of the substrate 264 may be selected to be different compared to the CET of the package substrate 270 in order to obtain the desired stress compensating effect. In other cases, any other appropriate materials, such as ceramics, organic materials and the like, may be used and may be appropriately fabricated by using any manufacturing techniques, as are well known in the art. For example, laser-based cutting techniques and the like may be efficiently used for precisely defining the lateral size and configuration of the substrate 264. In other cases, the contact structure 265 may be formed on the basis of micro electronic manufacturing techniques so as to provide a high degree of compatibility with processes for attaching the substrate 264 to the package substrate 270 with respect to the semiconductor die 250, when substantially the same process parameters are to be used. Similarly, providing the stress compensation region 260 at the same side of the substrate 270 as the semiconductor die 250 may also facilitate the fabrication process for providing the contact structures 275 and 278. It should be appreciated, however, that appropriate contact structures for the stress compensation region 260 or for any other stress compensation components may be readily provided above any surface of the substrate 270 in accordance with well-established manufacturing techniques.

Consequently, by providing the stress compensation region 260 as a separate component with respect to the package substrate 270, a high degree of compatibility may be achieved with respect to conventional process strategy since the package substrate 270 may be processed on the basis of well-established techniques, except for a modified layout and the one or more additional contact structures 278. Similarly, the component 260 may be processed on the basis of well-established manufacturing techniques, thereby providing an overall very efficient process flow. It should be appreciated, however, that a stress compensation region, such as the region 260, may be implemented into the package substrate 270 at any appropriate process phase during fabrication of the substrate 270, thereby providing the package substrate 270 and the stress compensation region 260 as an integral device after completion of the manufacturing process.

In some illustrative embodiments, the composite device 200 may be formed by mechanically coupling the semiconductor die 250 with the contact structure 275, while also the stress compensation region 260 may be in contact with the structure 278. Thereafter, the device 200 may be heated so as to achieve thermal equilibrium above the reflow temperature for the corresponding solder materials in the structures 255 and 265. Upon reflowing the solder material, an inter-metallic connection may be obtained and thereafter the device 200 may be cooled down, wherein, typically, the solder material in the stress compensation region 260 may solidify first and may thus efficiently compensate for the mechanical stress in the substrate 270, thereby also reducing the resulting stress and thus deformation, as indicated by 203, thereby in turn providing superior conditions in the chip receiving portion 279. Consequently, during the critical reflow process, a significantly reduced amount of sheer forces may be transferred into the semiconductor die 250 and thus into the sensitive metallization system. It should be appreciated that the thermal characteristics in combination with the positioning and the geometry of the stress compensation region 260 may be selected such that the resulting thermally induced stress or strain 203 may be substantially completely compensated for within the region 279.

Figure 2C:
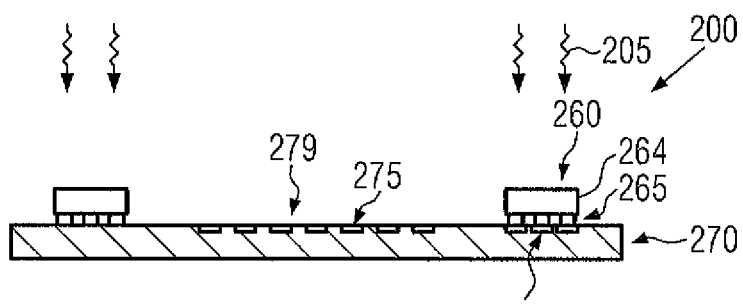
FIGS. 2c-2f schematically illustrate cross-sectional views of a package substrate and a semiconductor die during an assembly process, according to illustrative embodiments.

FIG. 2c schematically illustrates the package substrate 270 according to further illustrative embodiments in which the stress compensation region 260 may be formed on any appropriate position on the substrate 270 prior to actually attaching a semiconductor die to the chip receiving portion 279. As illustrated, during a contact process 205, heat may be applied so as to reach at least the reflow temperature of any solder material in the contact structure 265 and/or 278 or to mechanically couple the components 260 and 270 on the basis of heat and mechanical pressure. As illustrated, both components 260 and 270 may have the same equilibrium temperature and thus the mechanical coupling may be achieved without a pronounced deformation of any of these components.

Figure 2D:
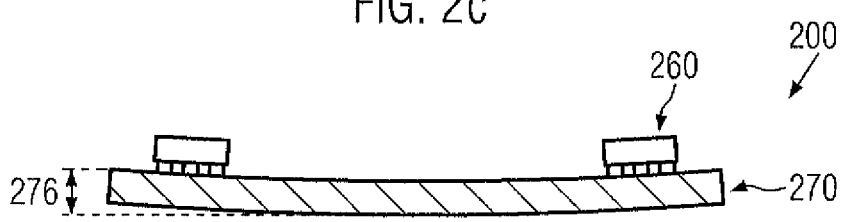

FIG. 2d schematically illustrates the package substrate 270, wherein the mismatch in the CET of the components 260 and 270 may result in a certain degree of bowing of the substrate 270, as indicated by 276.

Figure 2E:
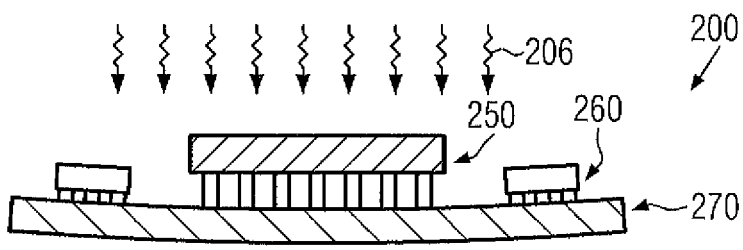

FIG. 2e schematically illustrates the package substrate 270 during a process 206 for attaching the semiconductor die 250 to the substrate 270. During the process 206, the substrate 270 and the semiconductor die 250 may be heated so as to reach equilibrium temperature above the reflow temperature of the solder material for attaching the semiconductor die 250. Consequently, the substrate 270 may take on a substantially non-deformed state upon reaching the equilibrium temperature due to the difference in thermal expansion between the substrate 270 and the stress compensation region 260. Upon reflowing the solder material, the temperature during the process 206 may be reduced so as to cool down the composite semiconductor device, wherein the stress compensation region 260 may tend to bend the substrate 270 upwardly, as is, for instance, illustrated in FIG. 2d, while, on the other hand, the mismatch in CET between the substrate 270 and the semiconductor die 250 may tend to bend the substrate 270 in the downward direction, as is, for instance, previously described with reference to FIG. 1a when referring to the semiconductor device 100. Consequently, on average, a significantly reduced overall thermally induced deformation may be achieved upon cooling down the semiconductor device 200.

Figure 2F:
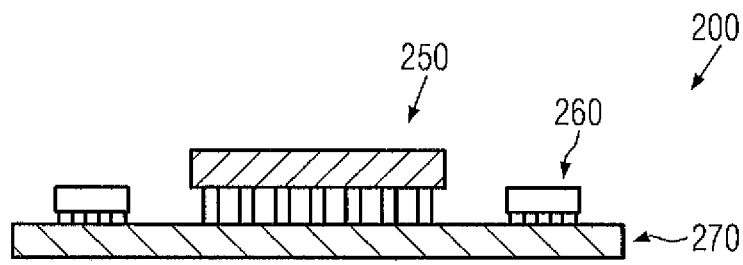

FIG. 2f schematically illustrates the device 200 in the final state, i.e., after passing through the cool-down phase for attaching the semiconductor die 250 to the package substrate 270. As illustrated, a substantially non-deformed state may be achieved.

It should be appreciated that the effect as described above with reference to FIGS. 2c-2f may also be obtained in the process strategy as described above with reference to FIG. 2b, in which the stress compensation region 260 and the semiconductor die 250 may be concurrently attached to the package substrate 270. Furthermore, it should be appreciated that the positioning and the configuration of the stress compensation region 260 may be modified in any appropriate manner, i.e., the region 260 may be positioned at the opposite side of the package substrate 270 or two or more stress compensation regions may be provided on one side or on both sides of the package substrate 270, wherein one component of the stress compensation region 260 may be positioned laterally within the chip receiving portion 279 (FIG. 2c).

Figure 2G:
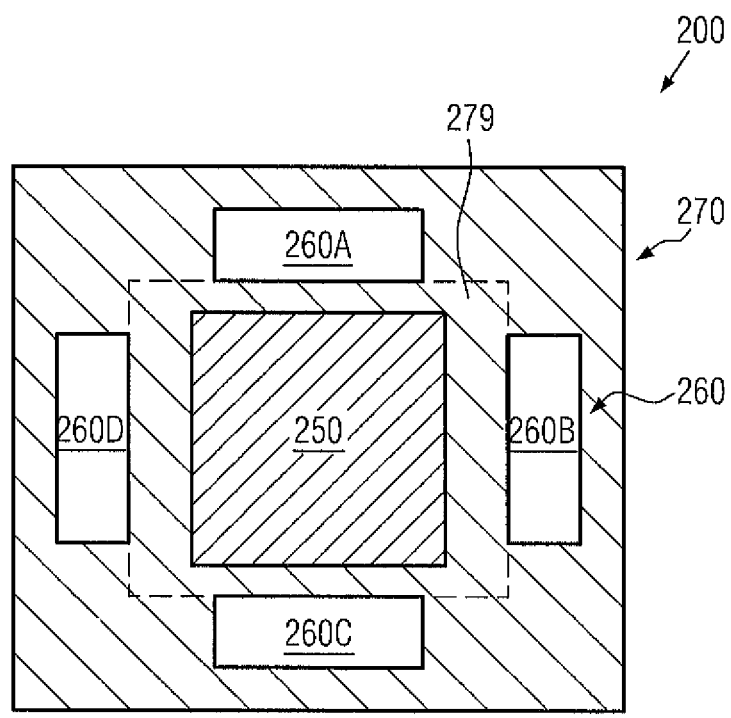
FIG. 2g schematically illustrates a top view of a packaged semiconductor device comprising a plurality of stress compensation segments formed on appropriate positions of the package substrate, according to further illustrative embodiments.

FIG. 2g schematically illustrates a top view of the composite semiconductor device 200 according to further illustrative embodiments in which the stress compensation region 260 may comprise a plurality of individual components 260A, 260B, 260C, 260D, which, however, may nevertheless extend along a significant portion of the circumference of the chip receiving portion 279. In this case, the individual components 260A, 260B, 260C, 260D may be formed in a highly efficient manner due to the "simple" geometric configuration of the individual components 260A, 260B, 260C, 260D. It should be appreciated again that, although the components 260A, 260B, 260C, 260D are illustrated to be positioned on the same side of the substrate 270 as the semiconductor die 250, in other illustrative embodiments (not shown), one or more components of the stress compensation region 260 may be positioned above the opposite surface of the substrate 270, or all of the components 260A, 260B, 260C, 260D may be positioned on the opposite surface of the substrate 270.

As a result, the present disclosure provides packaged semiconductor devices, superior package substrates and assembling procedures in which the mechanical effects in sensitive metallization systems of semiconductor devices may be efficiently reduced by reducing the degree of thermally induced deformation of a chip receiving portion of the package substrate. To this end, an efficient mechanism for compensating for thermally induced strain may be provided in the form of appropriately dimensioned and positioned stress compensation components or regions having specifically selected characteristics so as to compensate for the thermally induced deformation in the chip receiving portion, when rigidly attaching the stress compensation region to the package substrate. For example, the stress compensation region may be provided in the form of a stressor ring surrounding the chip receiving portion, which may have an appropriately selected CET in order to reduce or compensate for thermally induced stress in the sensitive metallization system of the semiconductor die, in particular during the critical reflow process. Thus, production yield and overall reliability of the packaged semiconductor device may be increased since appropriate reflow temperatures may be applied in combination with lead-free solder materials, while at the same time the number and degree of mechanical defects in the sensitive metallization system may be reduced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
    a semiconductor chip comprising a first metal-based c-N-p contact structure;
    a package substrate comprising a substrate portion connected to said first metal-based c-N-p contact structure; and
    a stress compensation region positioned laterally adjacent to and spaced apart from said semiconductor chip, said stress compensation region being configured to reduce a thermally induced deformation in said substrate portion, wherein said stress compensation region is connected to said package substrate by a second metal-based contact structure, and said first metal-based contact structure and said second metal-based contact structure have the same reflow temperature.

2. The semiconductor device of claim 1, wherein said stress compensation region and said semiconductor chip are positioned above the same surface of the package substrate.

3. The semiconductor device of claim 1, wherein said stress compensation region substantially completely laterally surrounds said semiconductor chip.

4. The semiconductor device of claim 1, wherein said first contact structure and said second contact structure are formed on the basis of lead-free conductive materials.

5. The semiconductor device of claim 1, wherein said stress compensation region comprises a dielectric material having a greater coefficient of thermal expansion compared to said package substrate.

6. The semiconductor device of claim 1, further comprising a metallization system formed above said semiconductor chip and comprising one or more metallization layers, wherein at least one of said one or more metallization layers comprises a dielectric material having a dielectric constant of approximately 3.0 or less.

7. A package for receiving a semiconductor chip, comprising:
    a package substrate comprising a semiconductor chip receiving section;
    a stress compensation region coupled to said package substrate via a first metal-based contact structure, wherein said stress compensation region extends and extending at least along a portion of a circumference of said semiconductor chip receiving section of said package substrate, said stress compensation region having a different coefficient of thermal expansion compared to said package substrate; and
    a second metal-based contact structure formed above said package substrate in said semiconductor chip receiving section that couples said package substrate to said semiconductor chip, wherein
    said first metal-based contact structure and said second metal-based contact structure have the same reflow temperature.

8. The package of claim 7, wherein said stress compensation region extends substantially completely along said circumference.

9. The package of claim 7, wherein said stress compensation region comprises a plurality of sections that are laterally separated from each other.

10. The package of claim 7, wherein said first and second metal-based contact structures are formed from lead-free metal materials.

11. The package of claim 7, wherein the coefficient of thermal expansion of said stress compensation region is greater than that of said package substrate.

12. A semiconductor device, comprising:
    a semiconductor chip comprising a first metal-based c-N-p contact structure;
    a package substrate comprising a substrate portion connected to said first metal-based c-N-p contact structure; and
    a stress compensation region positioned laterally adjacent to and spaced apart from said semiconductor chip, said stress compensation region being configured to reduce a thermally induced deformation in said substrate portion, wherein said stress compensation region is connected to said package substrate by a second metal-based contact structure, and said first contact structure and said second contact structure are formed on the basis of lead-free solder materials.

13. A package for receiving a semiconductor chip, comprising:
 a package substrate comprising a semiconductor chip receiving section;
 a stress compensation region coupled to said package substrate via a first metal-based contact structure, wherein said stress compensation region extends and extending at least along a portion of a circumference of said semiconductor chip receiving section of said package substrate, said stress compensation region having a different coefficient of thermal expansion compared to said package substrate; and
 a second metal-based contact structure formed above said package substrate in said semiconductor chip receiving section that couples said package substrate to said semiconductor chip, wherein
 said first and second metal-based contact structures are formed from lead-free solder materials.

* * * * *